United States Patent [19]

Wakayama et al.

[11] Patent Number: 5,243,235
[45] Date of Patent: Sep. 7, 1993

[54] SAMPLE-AND-HOLD CIRCUIT

[75] Inventors: Myles H. Wakayama, Tokyo; Hiroshi Tanimoto, Kawasaki, both of Japan

[73] Assignee: Kabushiki Kaisha Toshiba, Kawsaki, Japan

[21] Appl. No.: 784,872

[22] Filed: Oct. 30, 1991

[30] Foreign Application Priority Data

Oct. 30, 1990 [JP] Japan .................................. 2-292418
Sep. 20, 1991 [JP] Japan .................................. 3-241524

[51] Int. Cl.5 ...................... G11C 27/02; H03K 17/76
[52] U.S. Cl. ..................................... 307/353; 307/257; 307/321; 307/491
[58] Field of Search ............... 307/352, 353, 491, 257, 307/321

[56] References Cited

U.S. PATENT DOCUMENTS 4,659,946  4/1987  Agoston .............................. 307/353
4,879,478  11/1989  Gershon .
5,089,720  2/1992  Gloaguen ............................ 307/353

FOREIGN PATENT DOCUMENTS 0084259  7/1983  European Pat. Off. .
0108599  5/1988  Japan ................................. 307/353
0263699  10/1988  Japan ................................. 307/353

OTHER PUBLICATIONS

Electronic Design, vol. 35, No. 5, pp. 71-74, Mar. 5, 1987, F. Goodenough, "ISSCC: Analog".
John Markus, Sourcebook of Electronic Circuits, pp. 81-84 and p. 82, McGraw-Hill Book Company.

Primary Examiner—John Zazworsky
Attorney, Agent, or Firm—Oblon, Spivak, McClelland, Maier & Neustadt

[57] ABSTRACT

A sample-and-hold circuit comprising a diode circuit including four diodes connected in series, an input circuit connected to a first node of the first and third diodes and a second node of the second and fourth diodes, first and second output terminals connected to a third node of the first and second diodes and a fourth node of the third and fourth diodes, two capacitors connected to the third and fourth nodes, respectively, and a current mirror circuit having a first terminal connected to the input circuit, a second terminal connected to the first node, and a third terminal connected to the second node, for supplying to the second and third terminals, a DC bias current and a dynamic current corresponding to the slew rate of the input signal flowing through the first terminal of the current mirror circuit. The diode circuit charges the capacitor with the output current supplied from the current mirror circuit in accordance with the input signal, thereby to sample the input signal, and holds the charge in the capacitor upon completion of the charging of the capacitor, thereby to hold the input signal.

11 Claims, 11 Drawing Sheets

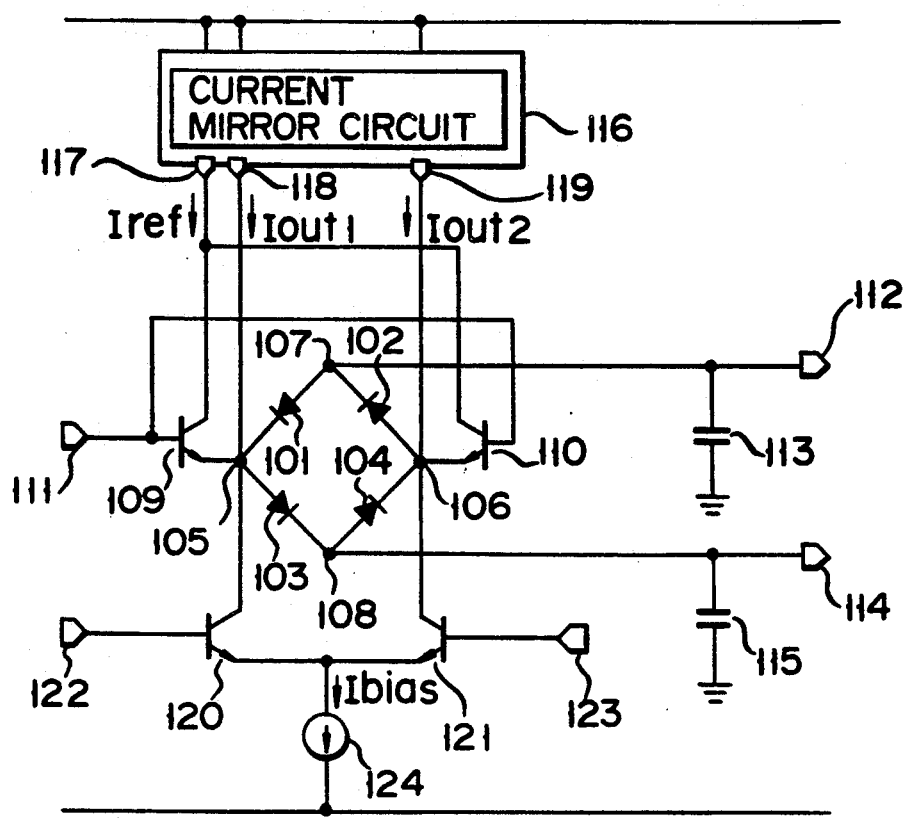
F I G. 1
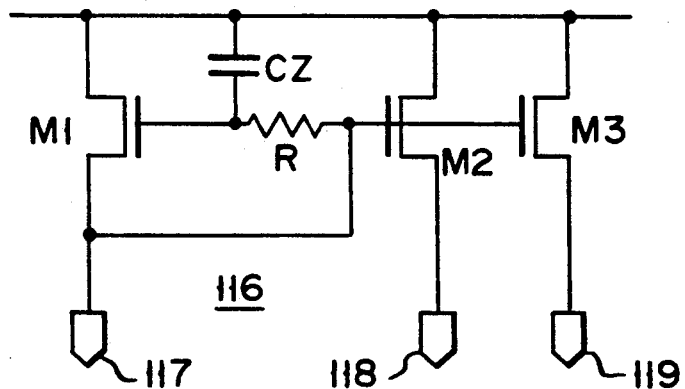
F I G. 5

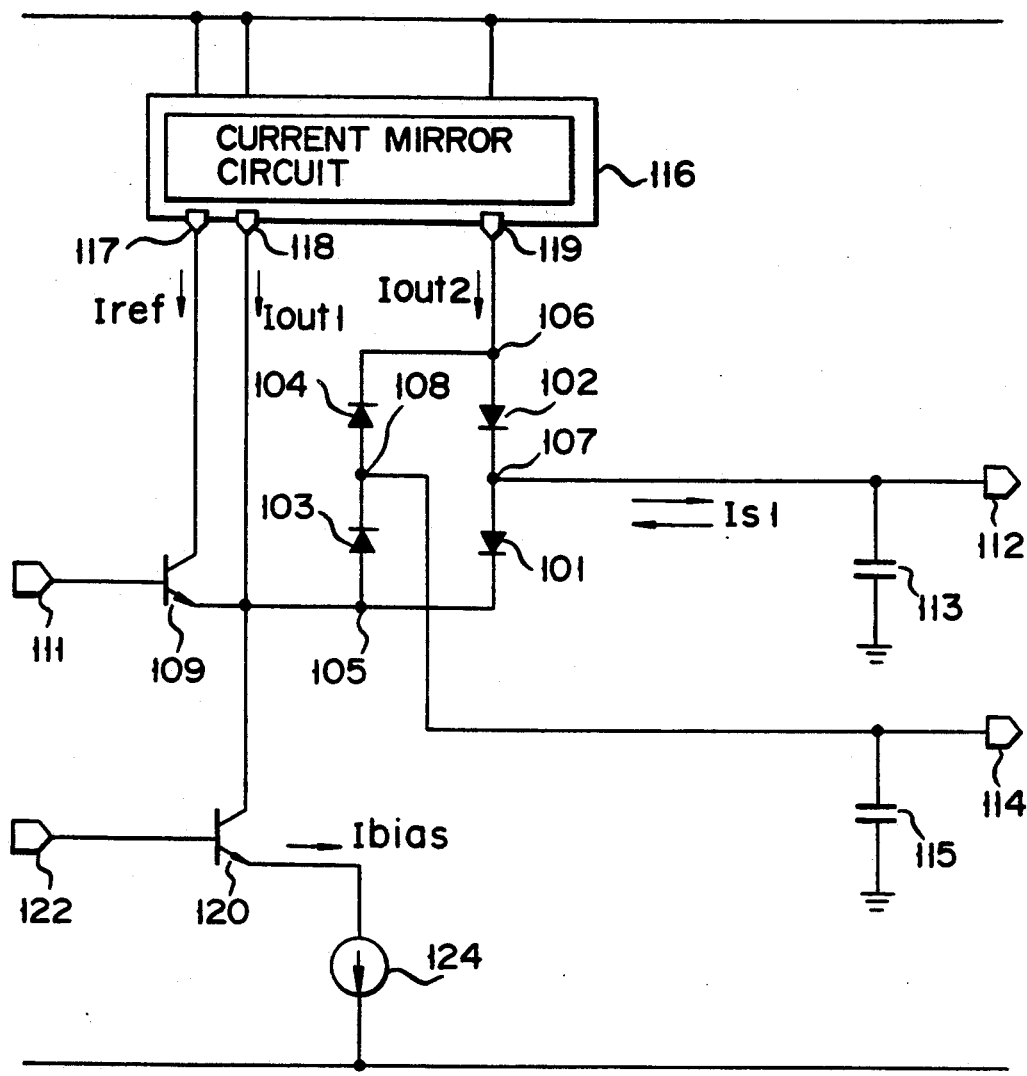
F I G. 2

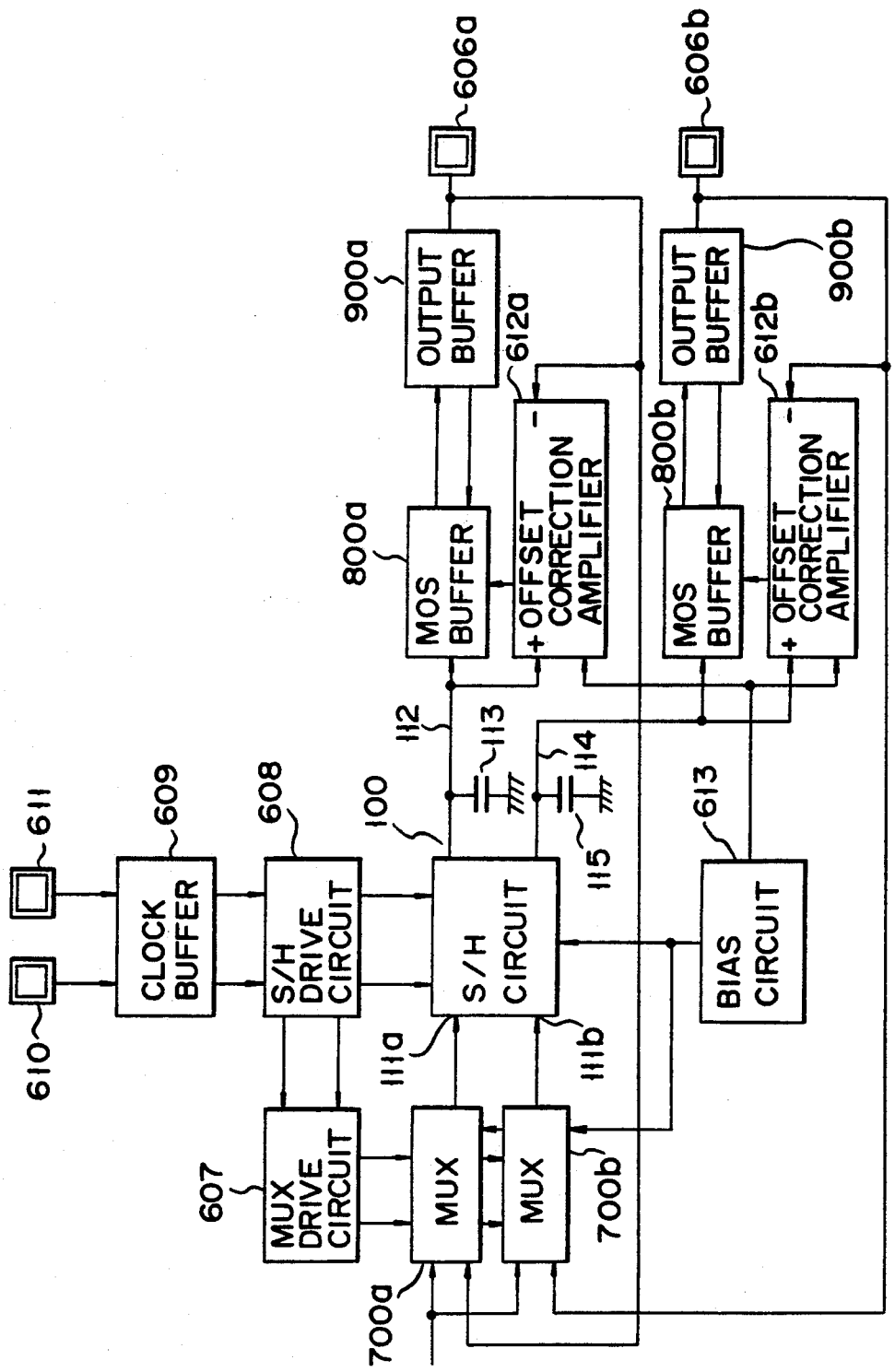
F I G. 11

SAMPLE-AND-HOLD CIRCUIT

BACKGROUND OF THE INVENTION

1. Field of the Invention

The present invention relates to a sample-and-hold circuit.

2. Description of the Related Art

Various types of sample-and-hold circuits are known. Of these circuits, the "diode-bridge sample-and-hold circuit" can operate at high speed with high accuracy.

The conventional diode-bridge sample-and-hold circuit has an input terminal 505, an output terminal 506, a capacitor 507 connected to the output terminal 506, three constant-current source circuits 508 to 510, two transistors 511 and 512 used as switching transistors, and a diode-bridge circuit as shown in FIG. 12. The diode-bridge circuit comprises four diodes 501 to 504. The common node of the first and second diodes 501 and 502 is connected to the input terminal 505, and the common node of the second and third diodes 503 and 504 is connected to the output terminal 506. The common node of the first and third diodes 501 and 503 is connected to the first constant-current source 508 and also to the collector of the first switching transistor 511. The common node of the second and fourth diodes 502 and 504 is connected to the second constant-current source circuit 509 and also to the collector of the second switching transistor 512. The emitters of both switching transistors 511 and 512 are connected to the constant current-supply circuit 510. Two clock signals 513 and 514 180° out of phase with respect to each other, are input to the bases of the transistors 511 and 512, respectively. The transistors 511 and 512 are thereby operated in opposite phases, whereby the sample-and-hold circuit can operate in two modes, i.e., sample mode and hold modes.

When the clock signals turn the first and second transistors 511 and 512 off and on, respectively, the sample-and-hold circuit is set in the sample mode. More precisely, once the first and second transistors 511 and 512 are turned off and on, respectively, the current Ibias supplied from the third constant-current source circuit 510 flows through the second switching transistor 512, biasing all diodes 501 to 504. If the signal at the input terminal 505 is constant with respect to time, the current Ibias/2 from the first constant current-source circuit 508 divides equally between the first and second diodes 501 and 502, and the third and fourth diodes 503 and 504, such that Ibias/4 flows through each of the diodes 501 to 504. This current combines with the current Ibias/2 supplied from the second constant-current source circuit 509 to equal the current drawn by current source 510 through transistor 512, Ibias. As a result, no output current "Is" flows to the output terminal 506, and the potential at the capacitor 507 connected to the output terminal 506 does not change. Further more, the voltage at the output terminal 506 equals the voltage at the input terminal 505 because the voltage drop across diodes 502 and 504, and diodes 501 and 503 are equal due to their equal bias currents.

If the voltage at the input terminal 505 is increased at a sufficient rate with respect to time, the current from the input signal source increases the current through the second diode 502 to greater than Ibias/2 and decreases the current through the first diode 501 to less than Ibias/2 by equal amounts, by half of the amount supplied by the input signal source. Since the current flowing through the second switching transistor 512 is Ibias and the current supplied by the current source 509 is Ibias/2, the sum of the currents flowing through the diodes 501 and 504 must equal Ibias/2. Likewise, since no current is drawn by the transistor 511 and the current supplied by the current source 508 is Ibias/2, again, the sum of the currents flowing through the diodes 502 and 503 must equal Ibias/2. In other words, the current flowing through the first diode path of diodes 501 and 502 is equal to that flowing through the second diode path of diodes 503 and 504 and in each case equals Ibias/4. Hence, as the current flowing through the second diode 502 increases, the current through the diode 504 must decrease by the same amount that the current through the diode 502 increases. Likewise, as the current through the diode 501 decreases, the current through the diode 503 must increase by the same amount that the current through the diode 501 decreases. The resulting difference in current between the diodes 503 and 504, "Is", charges the capacitor 507 until its voltage, the output terminal 506, is equal to that of the input terminal 505. At this point, the voltage drop across the diodes 501 to 504 become equal, and their difference in currents become zero, thus, "Is" becomes zero and the circuit achieves a stable condition.

Similarly, if the voltage at the input terminal 505 is decreased at a sufficient rate with respect to time, the current drawn by the input signal source decreases the current through the second diode 502 to less than Ibias/2 and increases the current through the first diode 501 to greater than Ibias/2 by equal amounts, by half of the amount drawn by the input signal source. As mentioned previously, the sum of the currents flowing through the diodes 501 and 504 must equal Ibias/2, and the sum of the currents flowing through the diodes 502 and 503 must equal Ibias/2. As the current flowing through the second diode 502 decreases, the current through the diode 504 must increase by the same amount that the current through the diode 502 decreases. And, as the current through the diode 501 increases, the current through the diode 503 must decrease by the same amount that the current through the diode 501 increases. The resulting difference in current between the diodes 503 and 504, "Is", discharges the capacitor 507 until its voltage, the output terminal 506, is equal to that of the input terminal 505. Again, the voltage drop across the diodes 501 to 504 become equal, and their difference in currents become zero, thus, "Is" becomes zero and the circuit achieves a stable condition.

It is important to understand that the charging-discharging current "Is" is equal to the input signal source current flowing into and out of the input terminal node 505. Furthermore, the maximum "Is" flows when the diodes 501 and 504 are off for an increasing input signal, or when the diodes 502 and 503 are off for a decreasing input signal. In the case of an increasing input signal, since the diode 501 is off, all of the current supplied by current source 508 flows into the diode 503. Since the diode 504 is off, the current through the diode 503 becomes "Is" and thus, the maximum value "Is" can achieve is Ibias/2. Likewise, for a decreasing input signal, the maximum value "Is" can achieve for discharging is also Ibias/2.

As can be understood from the above, when the first and second transistors 511 and 512 are turned off and on, respectively, the sample-and-hold circuit is set into the sample mode. Conversely, when the first and second transistors 501 and 502 are turned on and off, respectively, the first to fourth diodes 501 to 504 are turned off, essentially decoupling the input terminal 505 from the output terminal 506, maintaining the potential of the capacitor 507. In this case, the sample-and-hold circuit is set into the hold mode.

The conventional diode-bridge sample-and-hold circuit, however, has the following drawbacks:

First, its slew rate is insufficient, limited by the bias current Ibias/2 of the switching diodes. The bias current supplied to the diodes is usually small in order to reduce the power consumption of the sample-and-hold circuit and, more importantly, to decrease the DC sample pedestal offsets of the sample-and-hold circuit.

Secondly, the input impedance of the sample-and-hold circuit varies drastically when the operating mode is switched from the sample mode to the hold mode, and vice versa. This is because, in the diode bridge circuit, the input diodes 501 and 502 which are on in the sample mode are switched off i.e., open circuit, in the hold mode. To reduce the effect of the varying input impedance, a input buffer circuit is often added in front of the diode bridge circuit. This buffer circuit, however, increases the power consumption and noise of the circuit.

Thus the conventional diode-bridge sample-and-hold circuit suffers from two drawbacks, namely, insufficient slew rate and a drastically varying input impedance.

SUMMARY OF THE INVENTION

The object of the present invention is to provide a sample-and-hold circuit which achieves a high slew rate constant input impedance, without increasing the bias current of the switching diodes and, hence, the power consumption nor the DC and sample pedestal offset.

In an aspect of the invention, there is provided a sample-and-hold circuit comprising: a diode circuit including first to fourth diodes connected in series; an input circuit connected, at one end, to the common node of the first and third diodes and, at the other end, to the common node of the second and fourth diodes; an output circuit connected to at least one of two nodes, the first of which is the common node of the first and second diodes, and the second of which is the common node of the third and fourth diodes; a current mirror circuit with one current mirror output terminal connected to the common node of the first and third diodes and another current mirror output terminal connected to the common node of the second and fourth diodes; and a capacitor connected to the output terminal, wherein the current mirror circuit supplies the current mirror output terminal with an output current proportional to an input current signal.

In another aspect of this invention, there is provided a sample-and-hold circuit comprising: a diode circuit including first to fourth diodes connected in series; an input circuit connected, at one end, to the common node of the first and third diodes and, at the other end, to the common node of the second and fourth diodes; first and second output terminals connected to the common node of the first and second diode and the node of the third and fourth diodes, respectively; a current mirror circuit with one current mirror output terminal connected to the common node of the first and third diodes and another current mirror output terminal connected to the common node of the second and fourth diodes; and first and second capacitors connected to the first and second output terminals, respectively, wherein the first and second output terminal alternately deliver an output signal.

In the sample-and-hold circuit according to the first aspect of the invention, an output voltage signal which is equal to the input voltage with respect to time, is supplied to the output terminal during the sample mode. The use of a current mirror to bias the first to fourth diodes also provides an effective way to detect quickly changing input signals and automatically increases the current bias level of the diodes to greatly reduce the charge and discharge time of the capacitor and thus, greatly increase the speed of the sample-and-hold circuit in the sample mode. Reduction of the charge and discharge time of the capacitor is important for output signal accuracy during high speed sample mode operation. Furthermore, an input circuit is incorporated to drive the first to fourth diodes to maintain a constant input impedance seen at the input terminal.

The sample-and-hold circuit according to the second aspect of the invention retains all the advantages of the sample-and-hold circuit according to the first aspect of the invention, and also provides a second output terminal with a second capacitor in addition to the first output terminal and first capacitor, whereby the two output terminals and two capacitors operate in alternate modes. While the first output terminal and first capacitor are in the hold mode, the second output terminal and second capacitor are in the hold mode. In this way, at least one of the output terminals is providing an output signal at all times and therefore data can be read continuously from the sample-and-hold circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing a sample-and-hold circuit according to an embodiment of the present invention;

FIG. 2 is an equivalent circuit diagram applicable to the sample-and-hold circuit when the first and second output terminal thereof are set in the sample mode and the hold mode, respectively;

FIG. 5 is a circuit diagram showing the current mirror circuit incorporated in the sample-and-hold circuits shown in FIGS. 1 to 4A;

FIG. 11 is a circuit diagram of a sample-and-hold apparatus which has the sample-and-hold circuit according to the invention and which can hold two items of data at the same time.

DETAILED DESCRIPTION OF THE PREFERRED EMBODIMENTS

Figure 3:
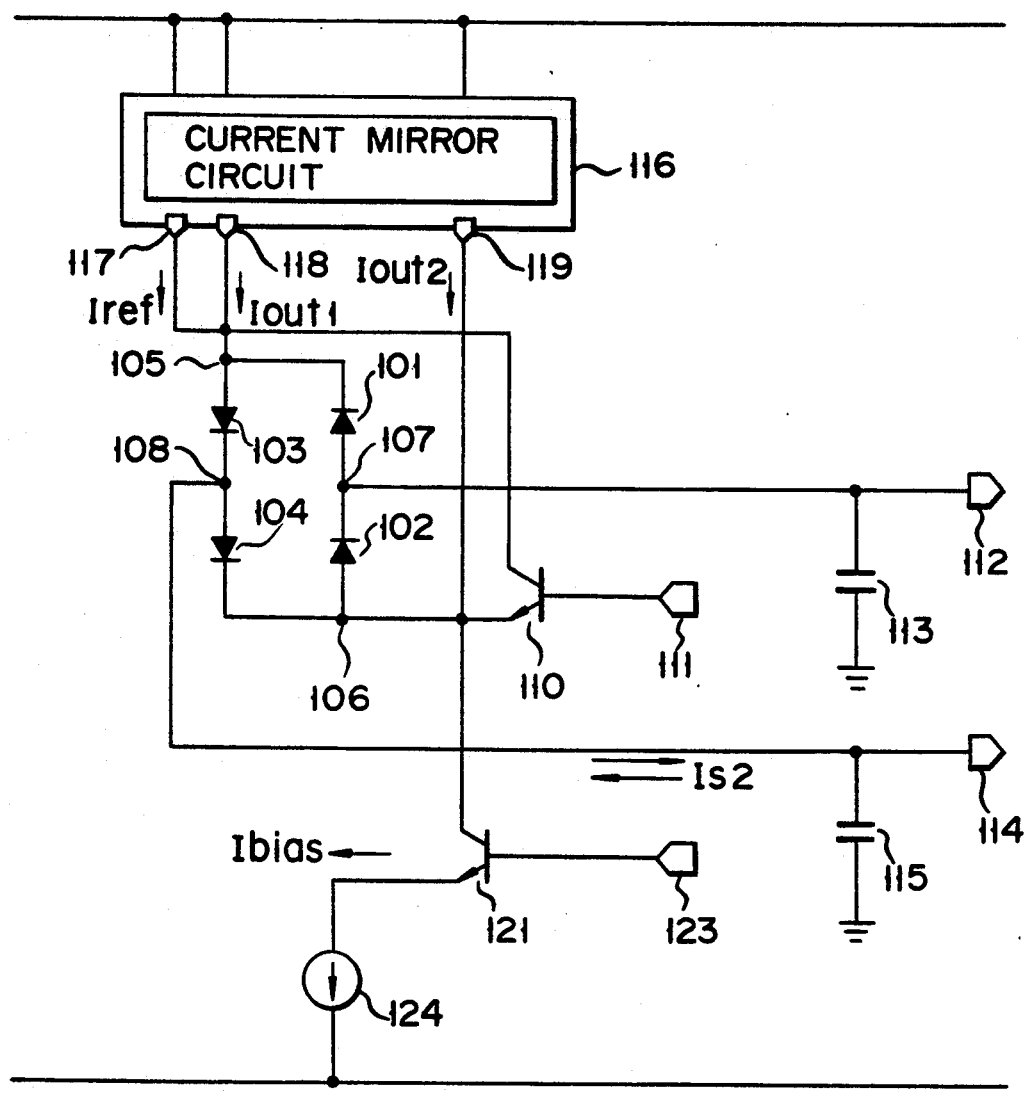
FIG. 3 is an equivalent circuit diagram applicable to the sample-and-hold circuit when the first and second output terminal thereof are set in the hold mode and the sample mode, respectively.

FIG. 1 shows a sample-and-hold circuit according to the present invention. As FIG. 1 shows, four diodes 101 to 104 are connected in series, forming a loop, or a switching circuit. In this switching circuit, the diodes 101 and 102 make a pair, and the diodes 103 and 104 make another pair. These diode pairs serve to achieve sampling operation and holding operation.

The node 105 of the diodes 101 and 103 is connected to the emitter of an npn transistor 109, which in turn is connected to a sampling input terminal 111. The node 106 of the diodes 102 and 104 is connected to the emitter of an npn transistor 110, which in turn is connected to the sampling input terminal 111. The transistors 109 and 110 constitute an input stage of the sample-and-hold circuit.

The node 107 of the diode 101 and 102 is connected to a first hold output terminal 112. A capacitor 113 is connected to the terminal 112 and functions as a hold capacitor. The node 108 of the diodes 103 and 104 is connected to a second hold output terminal 114. A capacitor 115 is coupled to the second hold output terminal 114 and functions as a hold capacitor.

As can be understood from FIG. 1, the sample-and-hold circuit has a current mirror circuit 116. The circuit 116 comprises a reference-current input terminal 117 and two output terminals 118 and 119. The input terminal 117 is connected to the collectors of the transistors 109 and 110. The first output terminal 118 is connected to the node 105 of the diodes 101 and 103. The second output terminal 119 is connected to the node 106 of the diodes 102 and 104.

The sample-and-hold circuit further comprises npn transistors 120 and 121, two clock input terminals 122 and 123, and a constant-current source circuit 124. The transistors 120 and 121 operates differentially with respect to each other. The transistors 120 and 121 are connected, at each base, to the clock input terminals 122 and 123, respectively. Two clock signals, which are out of phase, are supplied to the clock input terminals 122 and 123. The transistors 120 and 121 are connected, at each collector, to the diode nodes 105 and 106, respectively, and are commonly connected, at each emitter, to the constant-current source circuit 124. The circuit 124 biases both transistors 120 and 121.

In operation, when a clock signal is applied to the first clock input terminal 122 which is higher in potential than the clock signal applied to the second clock input terminal 123, transistor 120 is turned on, whereas the transistor 121 is turned off. The bias current Ibias supplied from the constant-current source circuit 124 flows through the collector-emitter path of the transistor 120. The base-emitter path of the transistor 109 is thereby forward biased, and the diodes pair 101 and 102 are also forward biased. Since the transistor 121 is off, the transistor 110 is reverse biased and, hence, is off. Likewise, the diodes 103 and 104 are reverse biased and, hence, are off. In this condition, the sample-and-hold circuit constitutes the equivalent circuit shown in FIG. 2.

In the equivalent circuit of FIG. 2, when a constant DC input signal is applied to the input terminal 111, a constant current Iref will flow into the collector to the emitter of the transistor 109 to the node 105. The first output 118 of the current mirror circuit 116 will output current Iout1 which also flow into the node 105. The second output 119 of the current mirror circuit 116 will output current Iout2 which will flow through the diode pair 102 and 101 also into the node 105. Current Ibias will flow out of the node 105 through the collector-emitter of the transistor 120 determined by the circuit 124. By definition of a current mirror circuit, output currents Iout1 and Iout2 of the current mirror circuit 116 will be equal to the input current Iref. Thus, Iref=Iout1=Iout2. Equating the currents flowing into and out of the node 105, Ibias=Iref+Iout1+Iout2, then we must have, Iref=Iout1=Iout2=Ibias/3. In this case, current Is1 is zero and the current flowing through the diode 10 and the transistor 109 are both equal to Ibias/3. If the diode 101 and the transistor 109 are fabricated such that their electrical characteristic are sufficiently similar, the base-emitter voltage of the transistor 109 and the forward bias voltage of the diode 101 will be equal, and thus, the output voltage provided by the sample-and-hold circuit at the output terminal 112 will be equal to the voltage applied at the input terminal 111.

For an input signal which varies with time, in order for the output voltage at the output terminal 112 to accurately track the input voltage at the input terminal 111, the capacitor 113 connected to the output terminal 112 must be charged or discharged by current Is1. The speed of the sample-and-hold circuit is determined by how quickly the capacitor 113 can be charged or discharged, and therefore, is determined by the maximum absolute value of current Is1.

For an input signal that increases with time, the current flowing through the transistor 109 will increase to beyond Ibias/3, and thus, Ire>Ibias/3. Thus, Iout1 and Iout2 of the current mirror circuit 116 will also increase beyond Ibias/3 such that, Iref=Iout1=Iout2>Ibias/3. In the case where the current mirror circuit 116 has a constant gain of one with respect to frequency, the maximum charging current Is1 is Ibias/2 which occurs when the diode 101 cuts off and Ibias from the transistor 120 equals the sum of the current Iref flowing through the transistor 109 and the output current Iout1 of the first output 118 of the current mirror circuit 116. This maximum charging current Is1 can be increased to Ibias if the current mirror circuit 116 has a DC gain of one and an AC gain greater than 1 which increases with frequency.

For an input signal that decreases with time, the current flowing through the transistor 109 will decrease to below Ibias/3, and thus, Iref<Ibias/3. Thus, Iout1 and Iout2 of the current mirror circuit 116 will also decrease below Ibias/3 such that, Iref=Iout1=Iout2<Ibias/3. Thus, the discharging current Is1 will be Ibias−(Iref+Iout1+Ibias/2). The maximum discharging current Is1 is Ibias which occurs when the transistor 109 cuts off and Iref=Iout1=Iout2=0.

When the output voltage signal of the output terminal 112 equals the input voltage signal, the bias currents of the diodes 101 and 102, the transistor 109, and the currents Iref, Iout1 and Iout2 of the current mirror circuit 116 return to Ibias/3 and thus, Is1 goes to zero. In this way, for any input signal which varies with time, the sample-and-hold circuit is capable of delivering up to Is1=±Ibias of current to charge and discharge the capacitor 113, enabling the output terminal 112 to track the input signal. Therefore, the sample-and-hold circuit operates in the sample mode with respect to the output terminal 112.

With respect to the output terminal 114, the diode pair 103 and 104 are reverse Biased. Thus, the node 108 is essentially open circuited and the charge stored on the capacitor 115 is preserved, holding a constant voltage on the output terminal 114. Therefore, the sample-and-hold circuit operates in the hold mode with respect to the output terminal 114.

When the clock signal applied to the first clock input terminal 122 is lower than the clock signal applied to the second clock input terminal 123, the transistors 120 and 121 are turned off and on, respectively. Then, the bias current Ibias supplied from the constant-current source circuit 124 flows through the collector-emitter path of the transistor 121. As a result, the transistor 110 and the diode pair 103 and 104 are forward biased. The transistor 109 is reverse biased and off, since the transistor 120 is off at this time. The diodes 101 and 102 are also reverse biased and off. In this condition, the sample-and-hold circuit constitutes the equivalent circuit shown in FIG. 3.

In the equivalent circuit of FIG. 3, when a constant DC input signal is applied to the input terminal 111, a constant current Iref will flow into the collector to the emitter of the transistor 110 to the node 106. The second output 119 of the current mirror circuit 116 will output current Iout2 which will also flow into the node 106. The first output 118 of the current mirror circuit 116 will output current Iout1 which will flow through the diode pair 103 and 104 also into the node 106. Current Ibias will flow out of the node 106 through the collector-emitter of the transistor 121 determined by the circuit 124. By definition of a current mirror circuit, output currents Iout1 and Iout2 of the current mirror circuit 116 will be equal to the input current Iref. Thus, Iref=Iout1=Iout2. Equating the currents flowing into and out of the node 106, Ibias=Iref+Iout1+Iout2, then we must have Iref=Iout1=Iout2=Ibias/3. In this case, current Is2 is zero and the currents flowing through the diode 104 and the transistor 110 are both equal to Ibias/3. If the diode 104 and the transistor 110 are fabricated such that their electrical characteristics are sufficiently similar, the base-emitter voltage of the transistor 110 and the forward bias voltage of the diode 10 will be equal, and thus, the output voltage provided by the sample-and-hold circuit at the output terminal 114 will be equal to the voltage applied at the input terminal 111.

For an input signal which varies with time, in order for the output voltage at the output terminal 114 to accurately track the input voltage at the input terminal 111, the capacitor 115 connected to the output terminal 114 must be charged or discharged by current Is2. The speed of the sample-and-hold circuit is determined by how quickly the capacitor 115 can be charged or discharged, and therefore, is determined by the maximum absolute value of current Is2.

For an input signal that increases with time, the current flowing through the transistor 110 will increase to beyond Ibias/3, and thus, Iref>Ibias/3. Thus, Iout1 and Iout2 of the current mirror circuit 116 will also increase beyond Ibias/3 such that, Iref=Iout1=Iout2>Ibias/3. In the case where the current mirror circuit 116 has a constant gain of one with respect to frequency, the maximum charging current Is2 is Ibias/2 which occurs when the diode 104 cuts off and Ibias from the transistor 121 equals the sum of the current Iref flowing through the transistor 110 and the output current Iout2 of the second output 119 of the current mirror circuit 116. This maximum charging current Is2 can be increased to Ibias if the current mirror circuit 116 has a DC gain of one and an AC gain greater than one which increases with frequency.

For an input signal that decreases with time, the current flowing through the transistor 110 will decrease to below Ibias/3, and thus, Iref<Ibias/3. Thus, Iout1 and Iout2 of the current mirror circuit 116 will also decrease below Ibias/3 such that, Iref=Iout1=Iout2 <Ibias/3. Thus, the discharging current Is1 will be Ibias−(Iref+Iout1+Iout2). The maximum discharging current Is2 is Ibias which occurs when the transistor 110 cuts off and Iref=Iout1=Iout2=0.

When the output voltage signal of the output terminal 114 equals the input voltage signal, the bias currents of the diodes 104 and 103, the transistor 110, and the currents Iref, Iout1 and Iout2 of the current mirror circuit 116 return to Ibias/3 and thus, Is2 goes to zero. In this way, for any input signal which varies with time, the sample-and-hold circuit is capable of delivering up to Is2=±Ibias of current to charge and discharge the capacitor 115, enabling the output terminal 114 to track the input signal. Therefore, the sample-and-hold circuit operates in the sample mode with respect to the output terminal 114.

With respect to the output terminal 112, the diode pair 102 and 101 are reverse biased thus, the node 107 is essentially open circuited and the charge stored on the capacitor 113 is preserved, holding a constant voltage on the output terminal 112. Therefore, the sample-and-hold circuit operates in the hold mode with respect to the output terminal 112.

As has been explained, the sample-and-hold circuit of the invention is designed to operate in the sample mode with respect to one of the output terminals 112 and 114, while operating in the hold mode with respect to the other output terminal. Hence, it can sample the input signal, while outputting the data it holds. Thus, the sample-and-hold circuit can sample signals and output held data at high speed. Furthermore, since the output currents of the current mirror circuit incorporated in the sample-and-hold circuit increases according to the input signal requirements, the sample-and-hold circuit has a greatly enhanced slew rate.

The output terminals 118 and 119 of the current mirror 116 may be replaced by two constant-current source circuits, and the collectors of the input transistors 109 and 110 may be connected to an appropriate power supply. In this case, when the sample-and-hold circuit is operated in the sample mode with respect to the output terminal 112, the maximum available current that charges or discharges the capacitor 113 will be Ibias/3, i.e., the standing current flowing through the diodes 101 and 102. By contrast, in the sample-and-hold circuit shown in FIG. 1, by virtue of the current mirror circuit 116, currents (Iref, Iout1 and Iout2) increase according to the requirements dictated by the input signal applied to the input terminal 111. Therefore, current Is1, which changes the potential of the capacitor 113 and the output terminal 112, increases in accordance with the slew rate of the signal input to the input terminal 111. The slew rate of the sample-and-hold circuit is thereby high, regardless of the bias current of the diodes 101 to 104. It follows that the bias current for the diodes 101 to 104 can be reduced. The power consumption of the sample-and-hold circuit can therefore be decreased. Furthermore, the DC offset of the circuit, resulting from the impedance mismatch resulting from the parasitic resistances or capacitances of the diodes 101 to 104, can also be reduced. As a result, the sample-and-hold circuit has its sampling accuracy enhanced.

The parasitic capacitances connected to the node 105 and 106 greatly affect the performance characteristics of the sample-and-hold circuit. If these parasitic capacitances are large, they add to the amount of capacitance that must be slewed for quickly varying input signals. These parasitic capacitances also increase the sample error, i.e., reduce the accuracy of the sample and hold. The negative effect caused by the parasitic capacitances can be reduced by increasing the capacitance values of the capacitors 113 and 115, however, this will also reduce the speed of the sample-and-hold circuit during the sample mode. In this light, it is important to reduce the parasitic capacitances on the nodes 105 and 106 as much as possible.

Figure 4A:
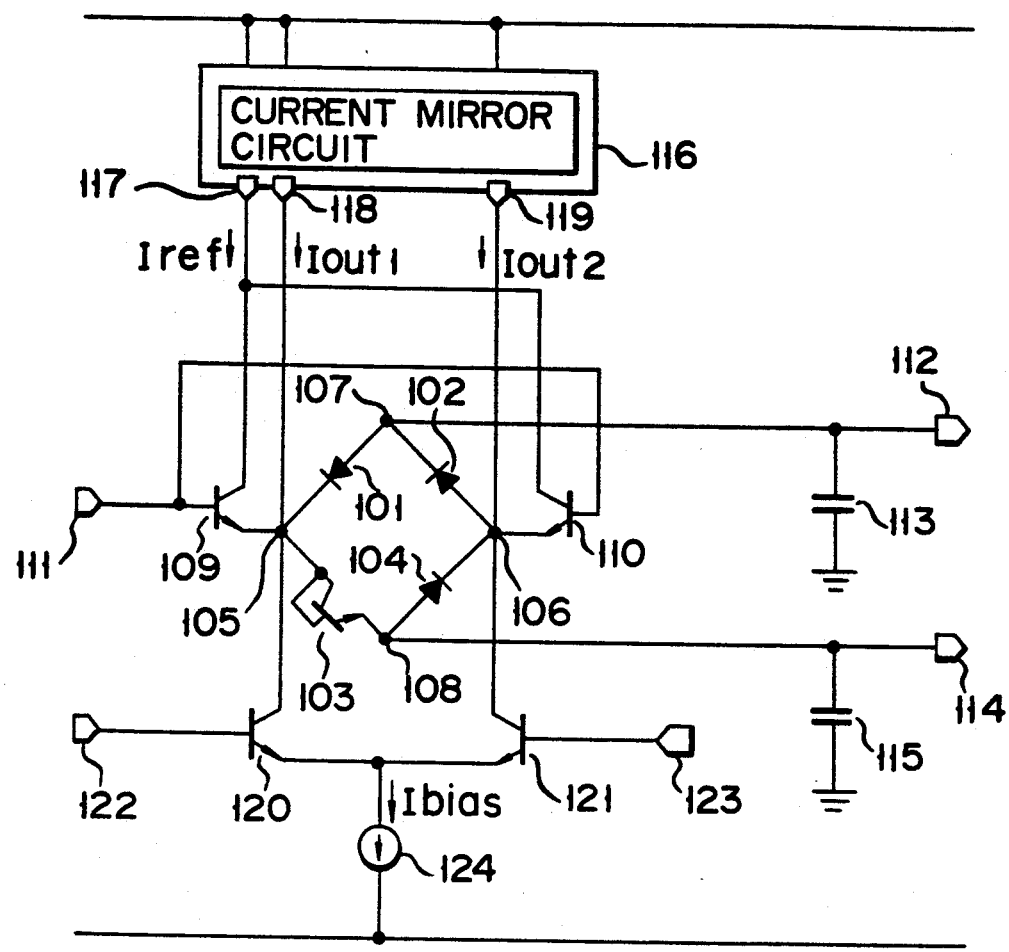
FIG. 4A is a circuit diagram showing a sample-and-hold circuit according to another embodiment of this invention.
Figure 4B:
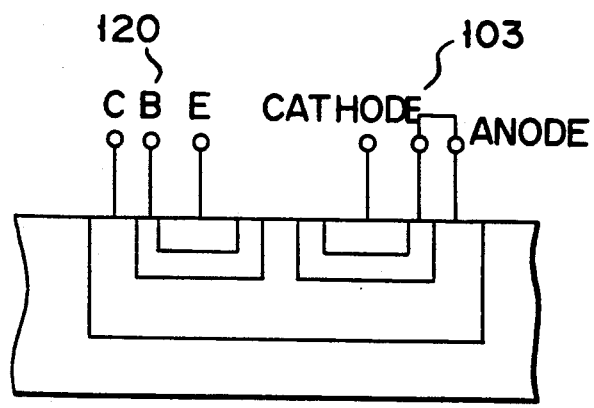
FIG. 4B is a cross-sectional view showing the semiconductor device incorporated in the circuit of FIG. 4A and comprising a diode and a switching transistor.

In general, most of the parasitic capacitances on the nodes 105 and 106 are related to the substrate-collector junction of the bipolar element connected to the nodes 105 and 106. Reducing this junction size can reduce the parasitic capacitances on the nodes 105 and 106. More specifically, as shown in FIG. 4A, the transistors 103 and 120 have a common collector terminal and thus, these devices can be combined into a single device with a common collector region formed in a substrate as shown in FIG. 4B. The individual base regions are formed in the collectors region, and the emitters are formed in the base regions, respectively. The base region of the transistor 103 is short-circuited to the common collector region, whereby the transistor 103 functions as a diode 103 whose anode and cathode are the common collector region and the emitter region of said one transistor, respectively. The transistor 120 has its base and collector not short-circuited.

No isolation region is formed between the transistors 103 and 120. The total junction area between the substrate and the collector region is smaller than in the case where separate isolation regions are formed between the transistors 103 and 120. Hence, the parasitic capacitances, existing between the substrate and the collector are reduced, enhancing sample-and-hold circuits sampling speed and accuracy.

The input impedance of the sample-and-hold circuit at the input terminal 111, is determined by a transistor which is off in either mode in parallel with a transistor which is biased by the current Ibias/3 supplied from the constant-current source circuit 124. Hence, the input impedance does not change when the operating mode of the circuit is switched from the sample mode to the hold mode, or vice versa. More specifically, with respect to the output terminal 112, the input impedance is determined by the input transistor 110 which is off, and by the input transistor 109 which is biased on at Ibias/3, during the sample-mode operation. During the hold-mode operation, the input impedance is determined by the input transistor 109 which is off, and by the input transistor 110 which is biased on at Ibias/3. Since the input transistors 109 and 110 are of an identical specification, the input impedance does not change when the operating mode is switched from the sample mode to the hold mode, or vice versa.

FIG. 5 shows the current mirror 116 incorporated in the sample-and-hold circuit of FIG. 1. The circuit 116 comprises three MOS transistors M1, M2, and M3, a resistor R, an input terminal 117, and two output terminals 118 and 119. The MOS transistor M1 functions as an input element, whereas the MOS transistors M2 and M3 function as output elements. The resistor R connects the gate of the transistor M1 to the gates of the transistors M2 and M3. The resistance of the resistor R and the parasitic capacitance of the transistor M1 and a capacitor CZ define a time constant. Because of this time constant, the current mirror circuit has a gain which increases with input signal frequency. At DC the gain is one.

The AC gain, AIAC, is given as follows:

$$AIAC = \{R \cdot Gm\}$$

where Gm is the transconductance of the transistors M1, M2, and M3.

Figure 6:
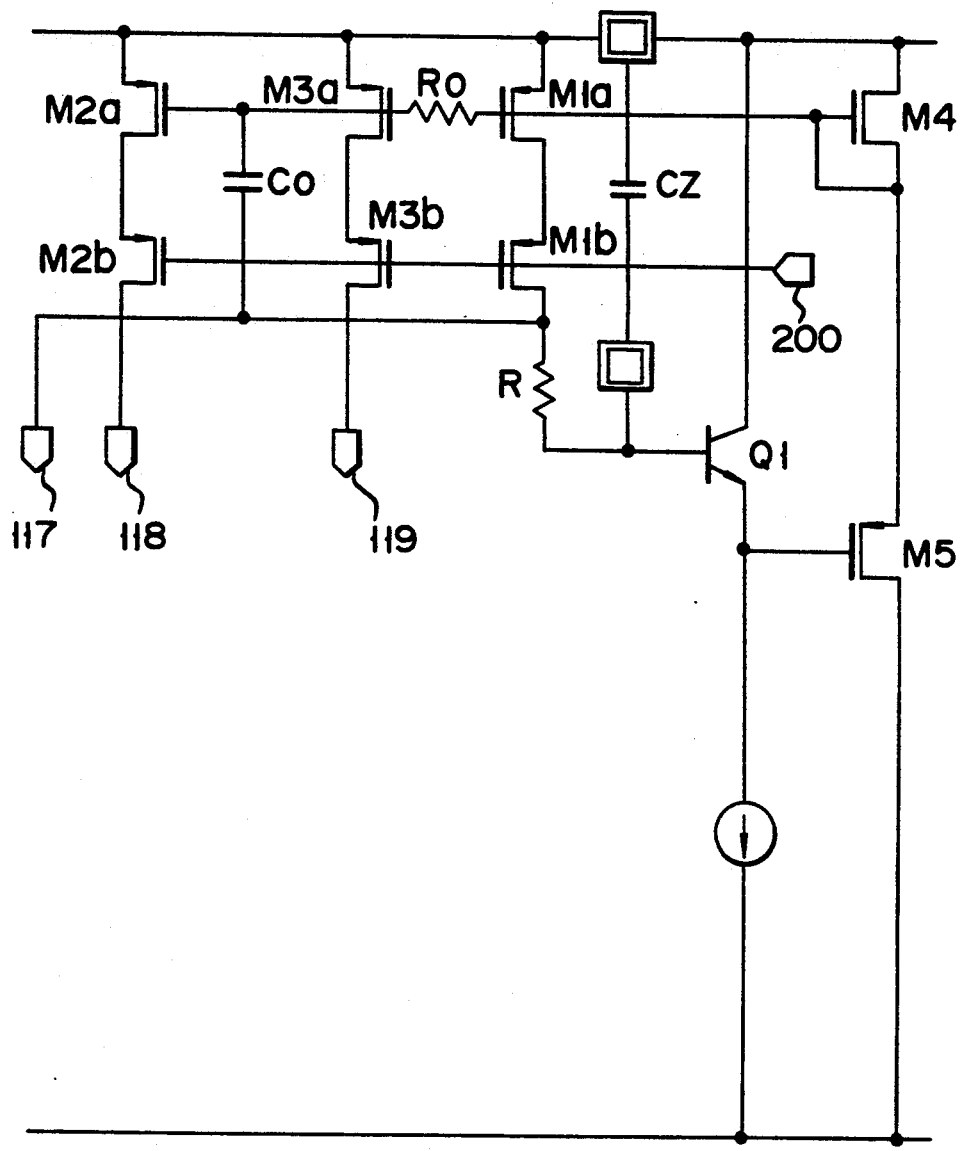
FIG. 6 is a diagram showing a cascode-connected current mirror circuit which can be used, in place of the circuit of FIG. 5, in the sample-and-hold circuit shown in FIG. 1.

FIG. 6 shows a current mirror circuit which can be used, in place of the circuit 116, in the sample-and-hold circuit shown in FIG. 1. This current mirror circuit comprises three pairs of MOS transistors, an input terminal 117, two output terminals 118 and 119, a bipolar transistor Q1, two MOS transistors M4 and M5, two resistors R and $R_0$, a capacitor $C_0$, and a bias terminal 200.

The terminals 117, 118, and 119 are identical to their counterparts shown in FIG. 5. The first pair of transistors M1a and M1b, the second pair of MOS transistors M2a and M2b, and the third pair of MOS transistors M3a and M3b correspond to the MOS transistors M1, M2, and M3 shown in FIG. 5. The transistors of each pair are cascode-connected to improve the current mirror circuit performance characteristics. The bias terminal 200, the bipolar transistor Q1, the MOS transistors M4, M5, the capacitor $C_0$, and the resistor $R_0$, are required to properly bias the cascoded structures. The terminal 200 is required to add a bias voltage to the MOS transistors M1b, M2b and M3b. The capacitor $C_0$ provides an AC short circuit between the input terminal 117 and the gates of the output MOS transistors M2a and M3a, thereby improving the high-frequency responsiveness. The resistor R0 blocks the input signal from passing through to the bias MOS transistors M1a and M4 fixed by the time constant defined by the capacitance CZ and the resistance R. Although structurally different, the current mirror circuit has an AC gain greater than one and a DC gain equal to one, similar to the current mirror circuit 116.

Figure 7:
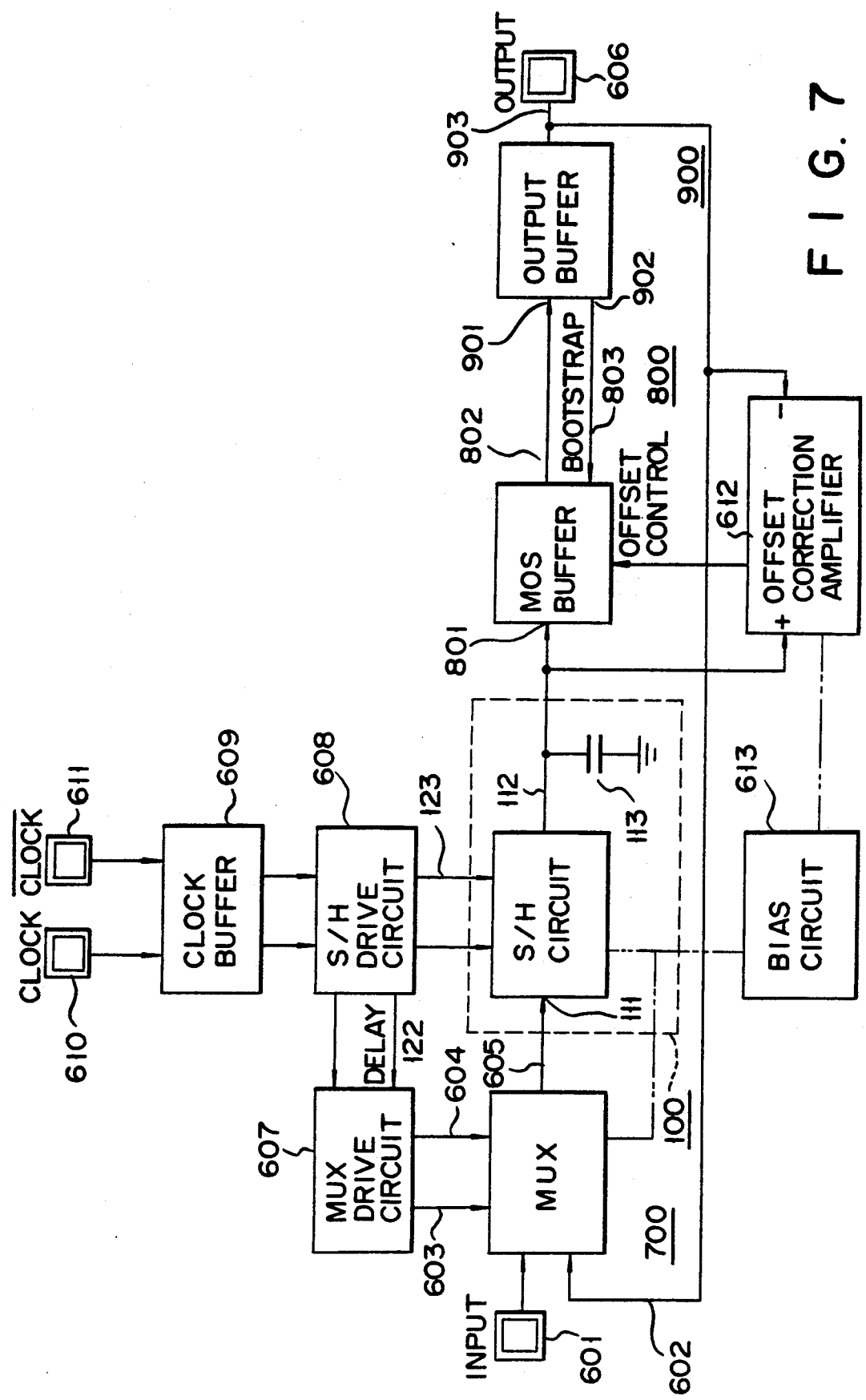
FIG. 7 is a block diagram of a sample-and-hold apparatus having the sample-and-hold circuit according to the invention.

FIG. 7 show a sample-and-hold apparatus having a sample-and-hold circuit 100 according to the invention. The apparatus further comprises an input terminal 601, a terminal 605, an output terminal 606, a multiplexer (MUX) 700, an intermediate buffer (MOS buffer) 800, and an output buffer 900. The multiplexer 700 selects the signal applied from the input terminal 601, or the signal applied from the output terminal 605, and applies the selected signal to the terminal 605. The sample-and-hold circuit 100 receives the signal output by the multiplexer 700. The intermediate buffer 800 receiver the signal 112 output by the sample-and-hold circuit 100, and supplies it to the output buffer 900. The output buffer 900 receiver the signal output by the buffer 800, and supplies it to the output terminal 606.

The sample-and-hold apparatus further comprises peripheral circuits, i.e., a clock buffer 609, an S/H drive circuit 608, an MUX drive circuit 607, an offset correction amplifier 612, and a bias circuit 613. The clock buffer 609 supplies the clock signals supplied from external clock signal generators 610 and 611 to S/H drive circuit 608 for switching the operating mode of the S/H circuit 111 incorporated in the sample-and-hold circuit 100. The MUX drive circuit 607 supplies a switching signal to the multiplexer 700 in response to the drive signal output by the S/H drive signal 608. The offset correction amplifier 612 corrects the DC offset generated by the MOS buffer 800 and the output buffer 900. The bias circuit 613 is designed to apply a bias to other components, said bias being free of influence of the ambient temperature.

Figure 8:
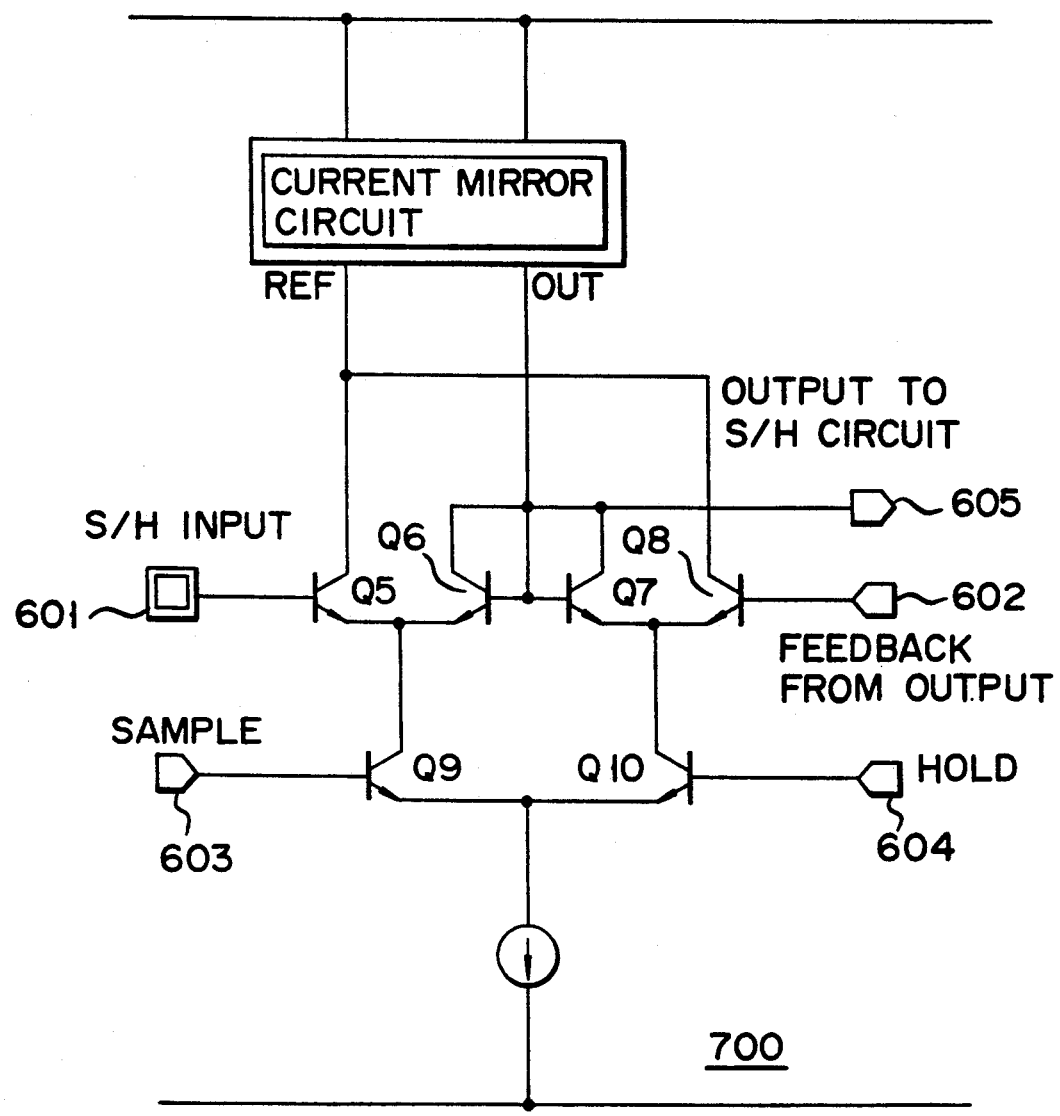
FIG. 8 is a diagram showing the multiplexer used in the apparatus of FIG. 7.

FIG. 8 shows the multiplexer 700 used in the apparatus of FIG. 7. As is evident from FIG. 8, the multiplexer 700 comprises three differential pairs of npn transistors. The first differential pair consisting of npn transistors Q5 and Q6, and the second differential pair consisting of npn transistors Q7 and Q8, are connected to the current mirror circuit (i.e., the load). The third pair consist of npn transistors Q9 and Q10. The collector of the transistor Q9 is connected to the emitter node of the transistors Q5 and Q6. The collector of the transistor Q10 is connected to the emitter node of the transistors Q7 and Q8. In operation, the signals input to the input terminals 601 and 602 are alternatively selected and output to the output terminal 605, in accordance with the two differential signals input to switching signal input terminals 603 and 604 for switching the operating mode of the sample-and-hold circuit 110. More precisely, when a switching signal is input to the switching signal input terminal 603, the transistor Q9 is turned on, biasing the emitters of the transistors Q5 and Q6, hence, turning on the transistors Q5+Q6. The current mirror circuit receives a reference current REF from the collector of transistor Q5 and supplies an output current OUT of the same magnitude as the current REF to bias transistor Q6. An output signal corresponding to the input signal applied at the input terminal 601 is thus supplied Via the output terminal 605 to the S/H circuit 111.

Figure 9:
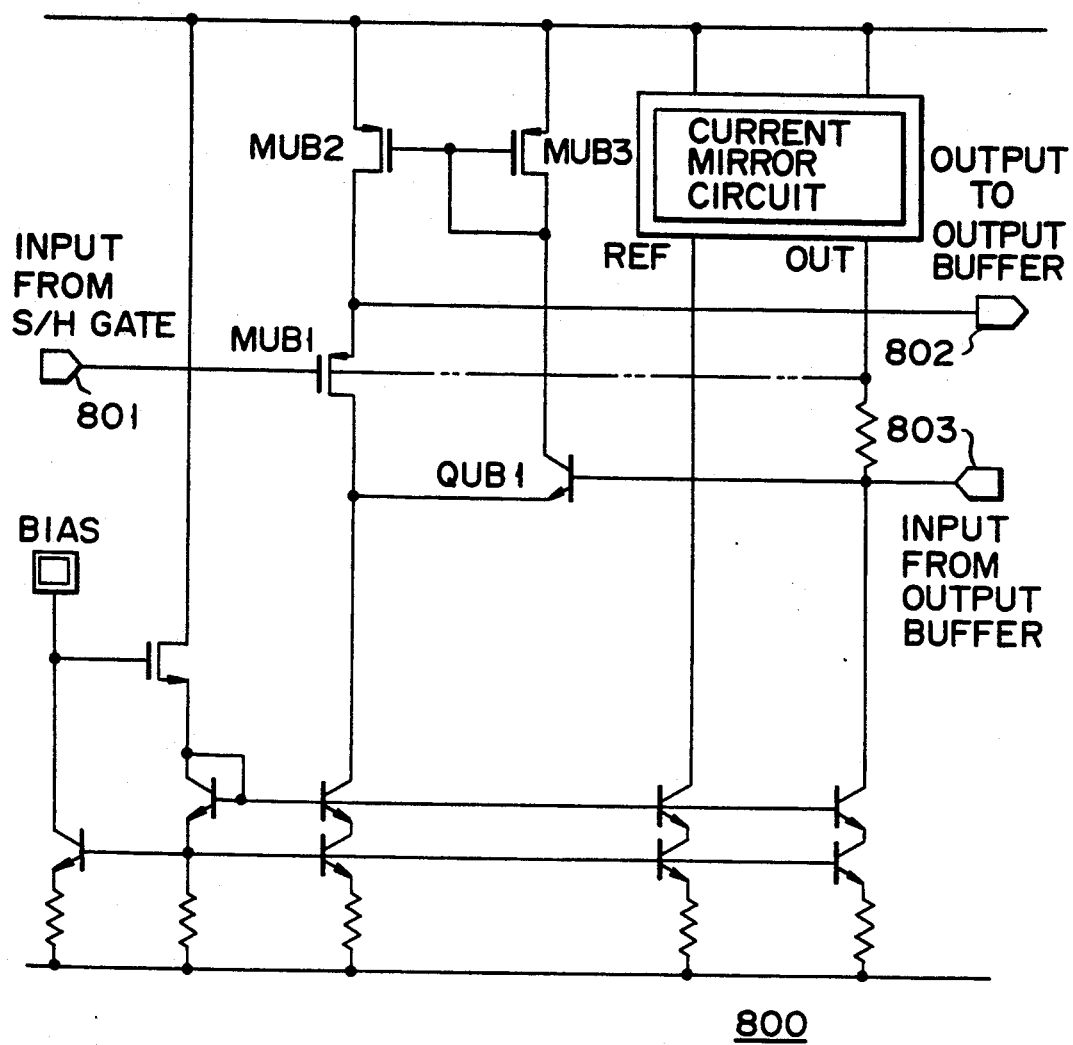
FIG. 9 is a diagram showing the MOS buffer circuit incorporated in the apparatus of FIG. 7.

FIG. 9 shows the MOS buffer 800 incorporated in the apparatus of FIG. 7. The MOS buffer 800 comprises an input terminal 801, an output terminal 802, a boot strap signal input terminal 803, and four MOS transistors MUB1, MUB2, MUB3 and QUB1. In operation, the buffer 800 receives the signal applied to the high impedance input terminal 801, and outputs this signal via the output terminal 802 with low impedance at a gain of one. The MOS buffer 800 is required for receiving, with a high input impedance, the output signal from the sample-and-hold circuit 100. A high impedance input stage is essential to preserve the held signal stored as charge on the capacitors 113 and 115 during their respective hold modes. If the input impedance of the MOS buffer 800 is too low, charge will leak from the capacitors 113 and 115 causing an error in the held value, degrading accuracy.

The MOS buffer 800 shown in FIG. 9 is essentially a source-follower type circuit, wherein the MOS transistor MUB1 is the first-stage element. The bootstrap signal input terminal 803 is provided to receive the bootstrap signal from the output buffer 900. This bootstrap signal is used to maintain a constant drain-source voltage across the first stage element MUB1 to reduce distortion. Furthermore, the bootstrap signal is used to actively bias the well of MUB1 to eliminate the body effect also reducing distortion.

Transistor QUB1 also provides a slew enhancement function for the MOS buffer 800. For fast rising input signals at the input terminal 801, the current flowing through the MOS transistor MUB1 will decrease. This decrease in current appears as an increase in current flowing through QUB1 which increases the current flowing through MUB3. Since the gates of MUB2 and MUB3 are connected, the current increase in MUB3 also occurs in MUB2. The increase in current of MUB2 provides extra current to raise the output voltage on the output terminal 802. Similarly, for fast decreasing input signals at the input terminal 801, the current flowing through the MOSW transistor MUB1 increases. This increase in current appears as a decrease in current flowing through QUB1 which decreases the current flowing through MUB3 and decreases the current flowing through MUB2. This decrease in current output from the drain terminal of MUB2 allows MUB1 to pull the output voltage at the output terminal 802 downward more quickly. In this way, bias circuit of QUB1, MUB2 and MUB3 actively adjusts the current available to drive the output terminal 802 and enhances the speed of the MOS buffer circuit 800.

Figure 10:
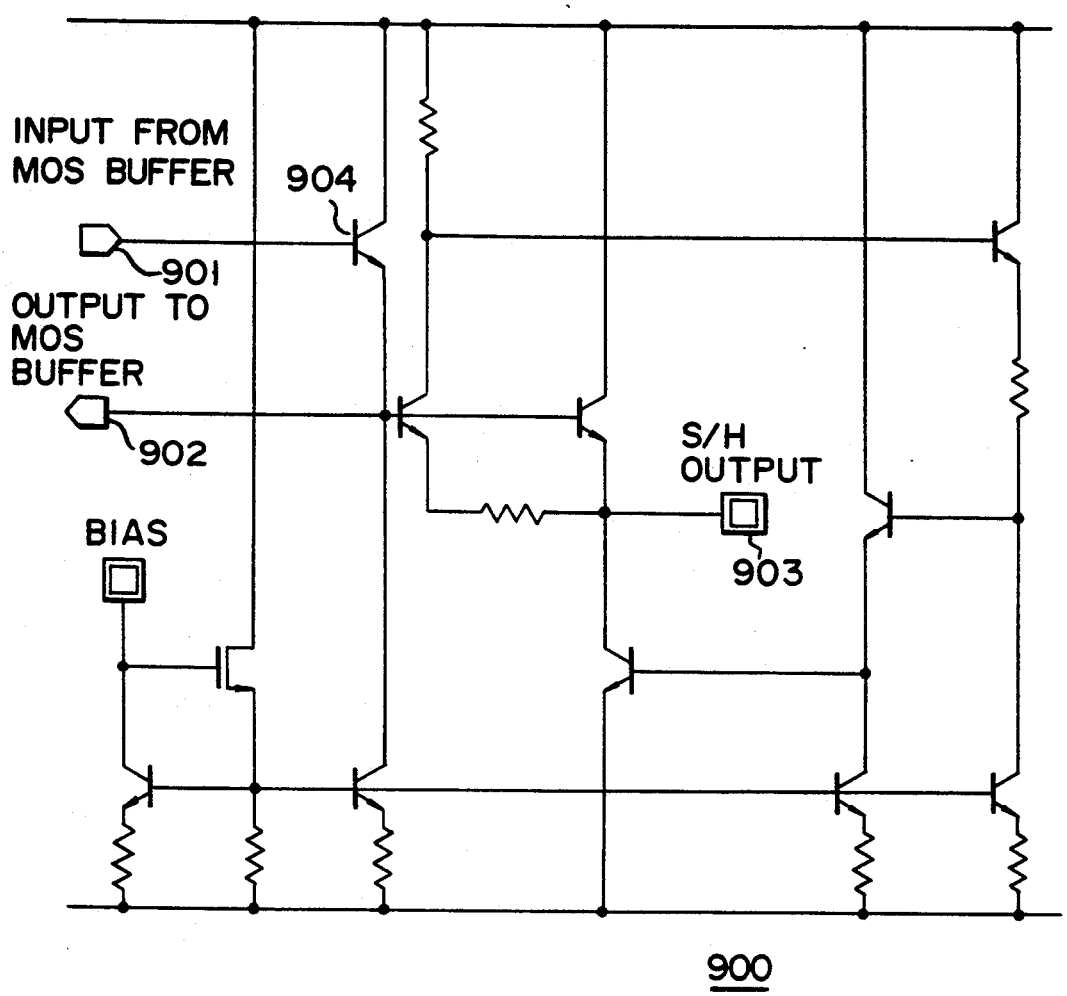
FIG. 10 is a diagram showing the output buffer used in the apparatus of FIG. 7.
Figure 12:
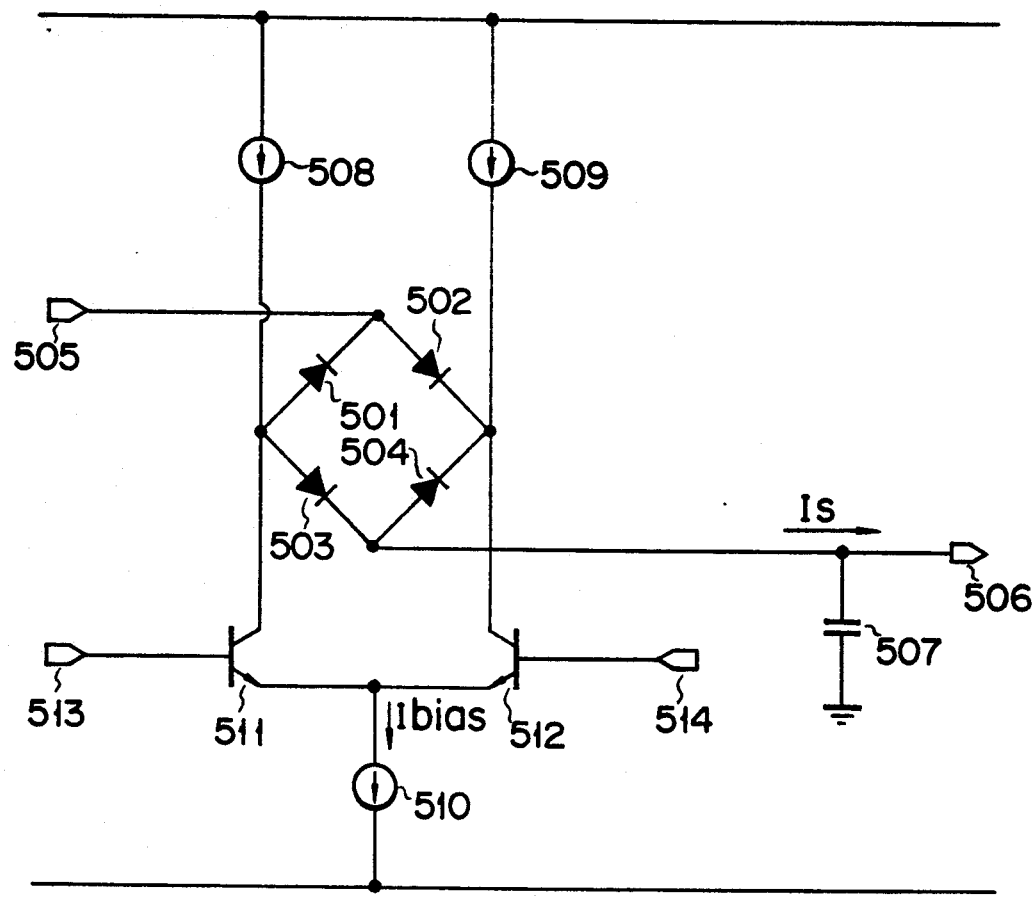
FIG. 12 is a circuit diagram showing a conventional sample-and hold circuit.

FIG. 10 shows the output buffer 900 used in the apparatus of FIG. 7. As is evident from FIG. 10, the output buffer 900 comprises an input terminal 901, a bootstrap signal output terminal 902, an output terminal 903, and the bipolar transistor 904. The signal voltage applied to the input terminal 901 is output from the output terminal 903 at low impedance, with gain of about one. The buffer 900 is essentially a darlington emitter follower. This emitter follower features an output stage employing a feedback which linearizes the output buffer 900 when driving low impedance loads at high speed. The bootstrap signal output terminal 902 is provided to supply a bootstrap signal to the previously described MOS buffer 800.

The multiplexer 700 is used to protect the sample-and-hold circuit 100 from excessively large input signal swings while the circuit 100 is operating in the hold mode. More specifically, in the hold mode, the held signal at the output terminal 112 on the capacitor 113 is read at the output terminal 903 of the output of the output buffer 900 at the second input terminal 602 to the multiplexer 700 and fed back to the input terminal 111 of the sample-and-hold circuit 100 blocking the input signal applied at the first input 601 to the multiplexer 700. This technique improves feed through rejection in the hold mode and also reduces sampled pedestal offset. If, however, the input signal swing to the sample-and-hold circuit 100 can be guaranteed to be sufficiently small, by use of a clamping circuit or the like, the multiplexer 700 becomes unnecessary.

As is shown in FIG. 7, the sample-and hold circuit 100 has only one output terminal 112. Instead, as is shown in FIG. 11, the circuit 100 can have two output terminals 112 and 114. In this case, two MOS buffers 800a and 800b, both identical to the MOS buffer 800 (FIG. 9), are connected to the output terminals 112 and 114, respectively, and two output buffers 900a and 900b, both identical to the output buffer 900 (FIG. 10), are connected to the MOS buffers 800a and 800b, respectively. Thus, the sample-and-hold apparatus of FIG. 11 can have two hold outputs 606a and 606b. In this case, the bases of the transistors 109 and 110 of the sample-and-hold circuit shown in FIG. 1, and used as the circuit 100 of the sample-and-hold apparatus of FIG. 11, are disconnected from each other, and connected to input terminals 111a and 111b, respectively. The input terminals 111a and 111b are connected to the multiplexer 700a and 700b, respectively.

The above sample-and-hold apparatus having two sample-and-hold circuit lines can sample the input signal two times faster than the sample-and-hold apparatus shown in FIG. 7, since the two sample-and-hold circuit lines alternately execute sample and hold modes.

As can be understood from the above, a sample-and-hold circuit according to the present invention can have a high slew rate, regardless of the bias current of the switching diodes. Hence, the bias current for the diodes is small. The power consumption of the sample-and-hold circuit can therefore be decreased, and the DC and sampled pedestal offsets of the circuit can also be reduced.

Furthermore, in the sample-and-hold circuit of the invention, the input signal is applied to the same load condition of two parallel transistors, whether the circuit is set in the sample mode or the hold mode. Thus, the input impedance remains unchanged when the operating mode in the sample mode or to the hold mode.

Moreover, another sample-and-hold circuit according to the present invention has two output channels. Hence, it can sample an input signal twice as fast as the conventional diode bridge sample-and-hold circuit. This circuit also retains the advantages of a high flows rate at reduced power consumption and low DC and sampled pedestal offsets, and a constant input impedance, independent of the operating mode, sample or hold.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A sample-and-hold circuit comprising:
a diode bridge circuit including first to fourth diodes connected in series;
input circuit means receiving an input signal having a predetermined level and connected to a first node of said first and third diodes and a second node of the second and fourth diodes;
output terminal means circuit having one of an output terminal and a pair of output terminals, said output terminal being connected to one of a third node of said first and second diodes and a fourth node of the third and fourth diodes, and said pair of output terminals being connected to said third node and said fourth node, respectively;
at least one capacitor connected to said output terminal means and used for sampling and holding the input signal; and
a current mirror circuit having a first terminal connected to said input circuit means, a second terminal connected to said first node, and a third terminal connected to said second node, for outputting a reference current to the first terminal, and an output current to the second and third terminals equal to the reference current, said reference current corresponding to the level of the input signal,
wherein said diode bridge circuit charges said capacitor with the output currents supplied from said current mirror circuit in accordance with the input signal, thereby to sample the input signal, and holds the charge in said capacitor upon completion of the charging of said capacitor, thereby to hold the input signal.

2. The sample-and-hold circuit according to claim 1, which further comprises a first switching transistor and a second switching transistor connected to said first node and said second node, respectively, and constant-current means to be connected to one of said first and second nodes by one of said first and second switching transistors, for supplying a constant current to one of said first and second switching transistors, and in which one of charging and discharging of said capacitor is performed, in accordance with the relationship between the constant current and the sum of the reference current and the output current.

3. The sample-and-hold circuit according to claim 2, wherein at least one of said third and fourth diodes comprises a diode-connected transistor having a collector which is also the collector of one of said first and second switching transistors.

4. The sample-and-hold circuit according to claim 1, wherein said current mirror circuit comprise cascode-connected current mirrors.

5. The sample-and-hold circuit according to claim 1, wherein said input circuit means has at least one transistor connected to the first terminal of said current mirror circuit, for supplying the reference current from said current mirror circuit, in accordance with the slew rate of the input signal.

6. A sample-and-hold circuit comprising:
a diode circuit comprising a plurality of diodes connected in series;
first and second input-stage transistors for flowing currents corresponding to a level of an input signal;
at least one capacitance connected between at least one of nodes of the diodes and a ground;
a constant-current source circuit for supplying a DC bias current to a first current junction node of said diode circuit and said first input-stage transistor and also to a second current junction node of said diode circuit and said second input-stage transistor;
a differential circuit comprising a first switching transistor connected between said first current junction node and said constant-current source circuit, and a second switching transistor connected between said second current junction node and said constant-current source circuit; and
a current mirror circuit having a reference current input terminal connected to the output terminal of said first and second input-stage transistors, a first current output terminal connected to said first current junction node, and a second current output terminal connected to said second current junction node of said diode circuit.

7. The sample-and-hold circuit according to claim 6, wherein said current mirror circuit produces a greater gain from an AC input signal than from a DC input signal.

8. A sample-and-hold circuit comprising:
first and second diode circuits, each comprising a plurality of diodes connected in series;
first and second input-stage transistors having output terminals for flowing currents corresponding to level of an input signal;
a first hold capacitance connected between a ground and a node of the diodes constituting said first diode circuit;
a second hold capacitance connected between the ground and a node of the diodes constituting said second diode circuit;
a constant-current source circuit for supplying a DC bias current to a first current node to which output currents of said first diode circuit and said first input-stage transistor are supplied, and also to a second current node to which output currents of said second diode circuit and said second input-stage transistor are supplied;
a differential circuit comprising a first switching transistor connected between said first current node and said constant-current source circuit, and a second switching transistor connected between said second current node and said constant-current source circuit; and
a current mirror circuit having a reference current input terminal connected to the output terminals of said first and second input-stage transistors, a first current output terminal connected to said first current node and an input terminal of said second diode circuit, and a second current output terminal connected to said second current node and an input terminal of said first diode circuit.

9. A sample-and-hold apparatus comprising:
a sample-and-hold circuit comprising current mirror circuit means for generating a reference current corresponding to a level of an input signal and at least one output current equal to the reference current, at least a first capacitor, and diode bridge circuit means connected to said current mirror circuit means and said first capacitor, for charging said first capacitor with the output current produced by said current mirror circuit means, thereby sampling the input signal, and for holding the charge in said first capacitor upon completion of the charging of said capacitor and output means connected to the diode bridge circuit means;
MOS buffer means connected to at least one of the output means of said sample-and-hold circuit; and
output buffer means connected to an output of said MOS buffer means.

10. The sample-and-hold apparatus according to claim 9, further comprising:
a clock buffer for outputting an internal clock signal in response to an external clock signal;
a drive circuit for switching the operating mode of said sample-and-hold circuit, from sample mode to hold mode, and vice versa, in response to the internal clock signal output by said clock buffer;
a multiplexer connected to the input of said sample-and-hold circuit;
a multiplexer drive circuit for supplying a switching signal to said multiplexer in response to a drive signal output by said drive circuit; and
an offset-correction amplifier for correcting offsets generated in said MOS buffer means and said output buffer means.

11. The sample-and-hold apparatus according to claim 9, wherein said sample-and-hold circuit has a second capacitor, and first and second output means connected to the first and second capacitors, respectively;
said MOS buffer means has first and second MOS buffers connected to said first and second output means, respectively; and
said output buffer means has first and second output buffers connected to the outputs of said first and second MOS buffers, respectively.

* * * * *